(12) United States Patent
Nakamura et al.

(10) Patent No.: US 6,428,332 B1
(45) Date of Patent: Aug. 6, 2002

(54) CONNECTOR FOR USE ON BOARD

(75) Inventors: Mitsuharu Nakamura; Tohru Kurosawa, both of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/584,726

(22) Filed: Jun. 1, 2000

(30) Foreign Application Priority Data

Jun. 2, 1999 (JP) .......................................... 11-155444

(51) Int. Cl.$^7$ ................................................ H01R 9/09
(52) U.S. Cl. ....................... 439/79; 439/76.1; 439/733.1
(58) Field of Search .......................... 439/78–79, 83–85, 439/733.1, 80, 76.1

(56) References Cited

U.S. PATENT DOCUMENTS

| 5,037,334 A | | 8/1991 | Viselli et al. | |
|---|---|---|---|---|
| 5,071,372 A | | 12/1991 | Viselli et al. | |
| 5,080,596 A | | 1/1992 | Viselli et al. | |
| 5,112,233 A | * | 5/1992 | Lybrand | 439/79 |
| 5,370,554 A | * | 12/1994 | Koyasu | 439/78 |
| 5,533,901 A | * | 7/1996 | Hunt et al. | 439/79 |
| 5,667,395 A | * | 9/1997 | Grabbe | 439/83 |
| 5,947,754 A | * | 9/1999 | Lin | 439/79 |
| 5,971,774 A | * | 10/1999 | Kuki et al. | 439/79 |
| 5,989,040 A | * | 11/1999 | Nischimatsu | 439/79 |

FOREIGN PATENT DOCUMENTS

| JP | 4-269473 | 9/1992 |
|---|---|---|
| JP | 8-162198 | 6/1996 |

* cited by examiner

*Primary Examiner*—Tho D. Ta
*Assistant Examiner*—Phuong Nguyen
(74) *Attorney, Agent, or Firm*—Oblon, Spivak, McClelland, Maier & Neustadt, P.C.

(57) ABSTRACT

A connector for-use-on-board includes a bar-like terminal protruding from a connector housing. A forward end of the terminal is soldered to a printed circuit conductor of a board. A position-regulating hole is formed in such a way as to pass through a position in the vicinity of the forward end of the terminal in a direction perpendicular to an axial line of the terminal. A position-regulating protrusion protrudes from the connector housing and is loosely fitted into the position-regulating hole with a prescribed clearance.

25 Claims, 6 Drawing Sheets

CONNECTOR FOR USE ON BOARD

CROSS-REFERENCE TO RELATED APPLICATIONS

This application is related to and claims priority, under 35 U.S.C. §119, from Japanese Patent Application No. 11-155444, filed on Jun. 2, 1999, the entire contents of which is hereby incorporated by reference herein.

BACKGROUND OF THE INVENTION

1. Field of the Invention

The present invention relates to a connector for-use-on-board having a connector housing, a bar-like terminal protruding from the connector housing wherein the terminal is soldered to a printed circuit conductor of the board so that the connector is mounted on the board.

2. Discussion of Background

A so-called "for-use-on-board connector" has a terminal that is electrically connected to a mating connector. A rear end of the terminal is drawn out from a connector housing, is soldered directly to a printed circuit conductor of the board, and is thereby mounted on the board. In this for-use-on-board connector, because a plurality of terminals are simultaneously inserted into insertion holes (through-holes) of the board, these terminals need to be positioned with respect to the connector housing.

This type of for-use-on-board connector is disclosed in Japanese Patent Application Laid-Open No. 8-162198 (hereinafter "JP '198"). The for-use-on-board connector of JP '198 prevents mis-alignment by being equipped with positioning means between a connector housing and a terminal. This for-use-on-board connector will now be explained with reference to FIGS. 1 to 3.

This for-use-on-board connector 1 is equipped with a connector housing 3, a male terminal metal fitting 5, and positioning means. The connector housing 3 has a plurality of through-holes 9 formed therein and the through-holes 9 are opened at a rear surface thereof.

Under the through-holes 9 of the connector housing 3, a plurality of fitting protrusions 11 are provided at the same pitches as those at which the through-holes 9 are provided.

A male terminal metal fitting 5 is obtained by bending so that the male terminal metal fitting 5 is L-shaped. The male terminal metal fitting 5 has a connecting portion 5a fitted to a female terminal metal fitting (not illustrated) and a leg portion 5b inserted into an insertion hole 13 of a printed circuit board P. The male terminal metal fitting 5 is mounted onto the connector housing 3 by forcing the connecting portion 5a into the through-hole 9 from a rear of the connector housing 3. The leg portion 5b has a fitting hole 15 formed therein and the fitting hole 15 permits the fitting protrusion 11 to pass therethrough. The fitting protrusion 11 and the fitting hole 15 constitute the positioning means 7.

In this for-use-on-board connector, when forcing the connecting portion 5a of the male terminal metal fitting 5 into its corresponding through-hole 9, the fitting protrusion 11 passes through the fitting hole 15. In this state, a forward end portion of the fitting protrusion 11, which protrudes rearwardly from the fitting hole 15 by means of a jig (not illustrated), is caulked so that the leg portion 5b is clamped by caulking head portions 11a. Then, the connector housing 3 is fixed to the printed circuit board P. Simultaneously, the leg portion 5b is fitted into the insertion hole 13.

According to the for-use-on-board connector 1 configured as described above, interfitting of the fitting protrusion 11 and the fitting hole 15 is reliably performed, the leg portion 5b is kept as its right attitude, and there is no possibility that the leg portion 5b will be mis-aligned.

However, the above-described conventional for-use-on-board connector has the following drawbacks. Namely, because the leg portion 5b is immovably fixed by caulking the forward end portion of the fitting protrusion that protrudes rearwardly from the fitting hole, the leg portion 5b is certainly unlikely to be mis-aligned. However, when the terminal is expanded or contracted during soldering thereof, the terminal gets out of position due to the resulting deformation directly acting on the soldered portion between the leg portion 5b and the insertion hole. As a result, cracks could possibly occur in the solder. Also, if the leg portion 5b is not immovably fixed in order to allow absorption of expansion and contraction, the terminal gets greatly mis-aligned. As a result, even when positioning the connector housing and the board relative to each other, positional coincidence of the leg portion with the insertion hole cannot be achieved. As a result, the problem results that the assembling operation that uses an automatic machine cannot be performed.

SUMMARY OF THE INVENTION

The present invention has been made in view of the above-described problems and has as one of its objectives, to provide a connector for-use-on-board which can absorb the deformation of the terminal due to the expansion or contraction thereof during soldering thereof and can position the terminal relative to the connector housing, thereby preventing the occurrence of cracks in the solder and enabling the performance of the assembling that uses an automatic machine.

To attain the above-described objective, a connector for-use-on-board, according to a first aspect of the present invention, includes: a bar-like terminal protruding from a connector housing, wherein a forward end of the terminal is soldered to a printed circuit conductor of a board; a position-regulating hole which is formed in such a way as to pass through a position in the vicinity of the forward end of the terminal in a direction perpendicular to an axial line of the terminal; and a position-regulating protrusion protruding from the connector housing, the position-regulating protrusion being loosely fitted into the position-regulating hole with a prescribed clearance.

In this connector for-use-on-board, the terminal is retained and positioned so that the terminal may be movable within a prescribed range. As a result of this, unlike a case where the terminal is completely fixed, even when the terminal is expanded or contracted during soldering thereof, the amount of deformation thereof is absorbed as the deformation of the terminal as a whole. Accordingly, a large stress resulting from the deformation ceases to be applied to a joint portion between the terminal and the printed circuit conductor. Accordingly, solder cracks that will occur when the terminal is completely fixed are prevented. Also, the terminal is positioned within a prescribed range. Therefore, if relatively positioning the connector housing and the board, the positional correspondence of the terminal to the printed circuit conductor makes it possible to realize the assembling operation using an automatic machine.

A connector for-use-on-board, according to a second aspect of the present invention, further includes: a base portion of the terminal which protrudes from the connector housing; a bent portion which is formed in the terminal between the base portion and the position-regulating hole;

and an arraying plate which protrudes from the connector housing, the arraying plate being provided with the position-regulating protrusion, the arraying plate being parallel with the terminal on a forward end side from the bent portion.

In this connector for-use-on-board, the expansion or contraction of the terminal are reliably absorbed by the bent portion. As a result, compared to a case where the terminal is in a straight-line form, a stress that is applied to the joint portion between the terminal and the printed circuit conductor becomes small. Therefore, the occurrence of solder cracks become more unlikely. Also, the arraying plate is disposed along the terminal that has been bent and the position-regulating hole of the terminal is loosely fitted over the position-regulating protrusion provided on the arraying plate. As a result of this, the terminal is movably retained in a desired array.

A connector for-use-on-board according to a third aspect of the present invention has the terminal mounted in the connector housing by insertion molding in a manner such that the terminal projectingly protrudes from the connector housing.

In this connector for-use-on-board, the base portion of the terminal that protrudes from the connector housing is reliably fixed without using a special fixing structure. As a result of this, a terminal structure, wherein the base portion is rigidly fixed while the forward end is movable, can be constructed in a simple form.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1:
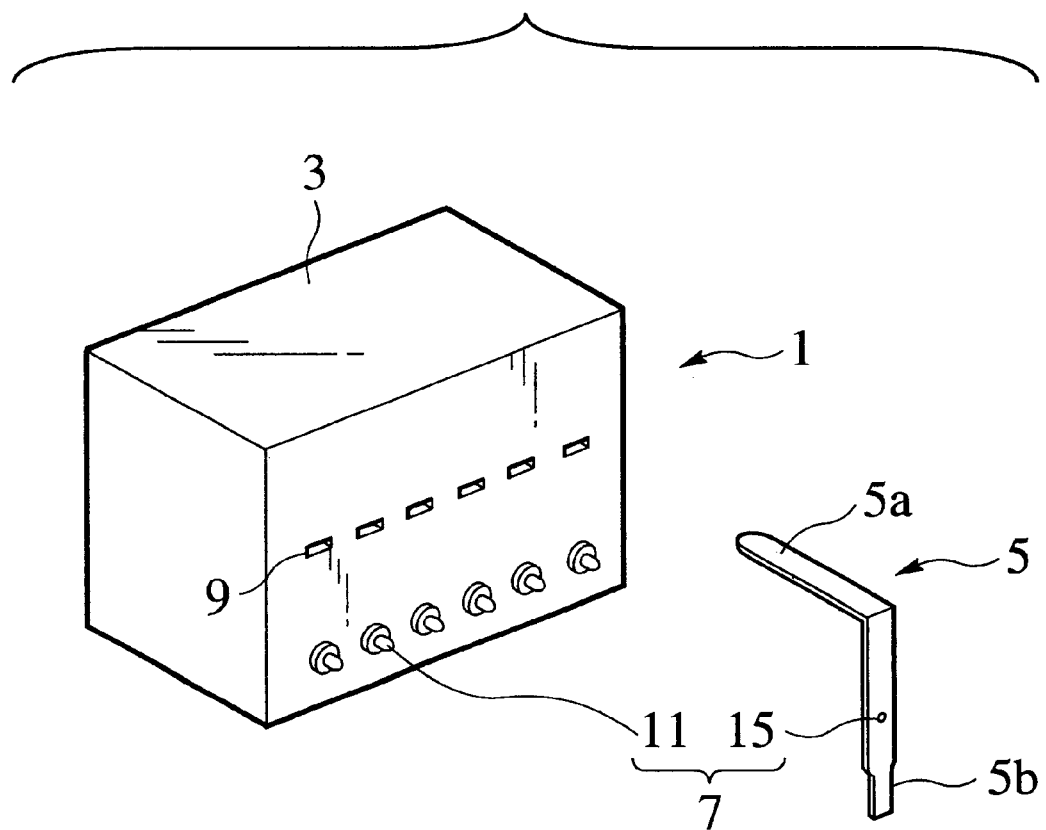
FIG. 1 is an exploded perspective view illustrating a conventional for-use-on-board connector.
Figure 2:
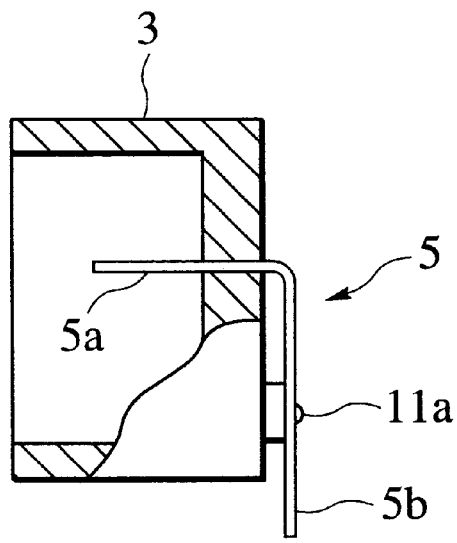
FIG. 2 is a cross-sectional view illustrating the conventional for-use-on-board connector.
Figure 3:
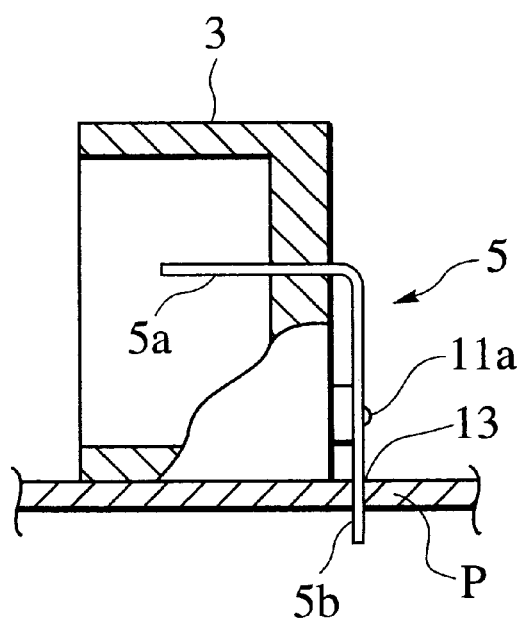
FIG. 3 is a partial cross-sectional view illustrating the conventional for-use-on-board connector that has been mounted on a board.

A preferred embodiment of the present invention will hereafter be explained in detail with reference to the drawings.

Referring to FIGS. 4–7, a connector housing 23 of a for-use-on-board connector 21 has a hood portion 23a that a mating connector is inserted in, and a flange portion 23b that is formed on a rear end surface of this hood portion 23a. In the connector housing 23, a plurality of bar-like terminals 25 are provided in an array. In the terminal 25, an electrical-contact portion 25a thereof, that is electrically contacted with a mating connector, is made to protrude within the hood portion 23a. On the other hand, a leg portion 25b, that is connected to a printed circuit board (not illustrated), is vertically drawn out from the flange portion 23b. The terminal 25 is projectingly provided, for example, by insertion molding that is done with respect to the connector housing 23.

The leg portion 25b, of this embodiment, has a bent portion 27 in the form of a crank. Namely, the portion in the vicinity of a protruding portion of the terminal 25, which protrudes from the flange portion 23b, is bent a first time so as to be parallel with the flange portion 23b at a first bent portion 27a. From this bent portion 27a, a forward end side is bent vertically with respect to the flange portion 23b at a second bent portion 27b.

On the flange portion 23b, an arraying plate 29 is projectingly vertically provided. The arraying plate 29 is disposed in parallel with the terminal 25 on the forward end side from the bent portion 27 thereof.

In the terminal 25 on the forward end side from the bent portion 27, a position-regulating hole 31 is formed. This position-regulating hole 31 passes through a portion of the terminal 25, in the vicinity of the forward end of the terminal 25, in a direction intersecting an axial line of the terminal 25 at a right angle with respect to the terminal 25.

Figure 5:
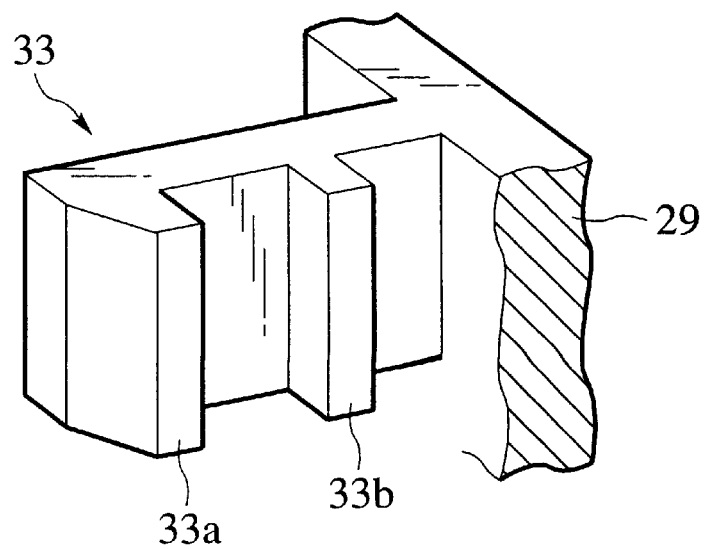
FIG. 5 is an enlarged perspective view illustrating a position-regulating protrusion illustrated in FIG. 4.

On the arraying plate 29, position-regulating protrusions 33 are projectingly provided at positions corresponding to the position-regulating holes 31 of the terminal 25. As illustrated in FIG. 5, each position-regulating protrusion 33 is formed in the shape of a rectangular plate and each position-regulating protrusion 33 perpendicularly protrudes from an opposing surface of the arraying plate 29 to the terminal 25. On a forward end portion of the position-regulating protrusion 33, a steeple portion 33a is formed. Also, between this steeple portion 33a and a base portion of the position-regulating protrusion 33, a convex wall 33b is formed.

Figure 6:
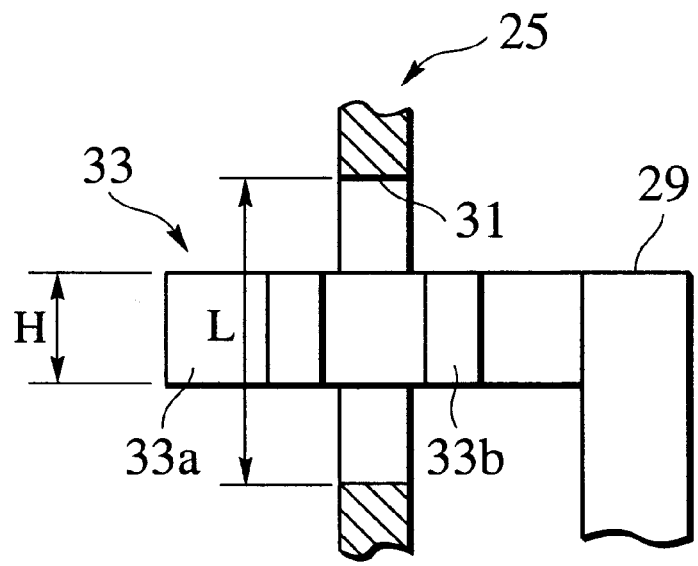
FIG. 6 is a partial cross-sectional view taken along line VI—VI of FIG. 4, which illustrates a state where a terminal is loosely fitted over a position-regulating protrusion.
Figure 7:
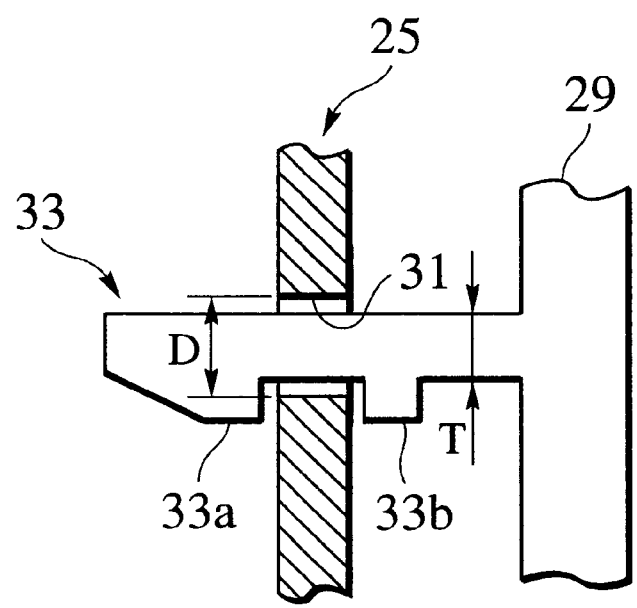
FIG. 7 is a partial cross-sectional view taken along line VII—VII of FIG. 4, which illustrates the state where the terminal is loosely fitted over the position-regulating protrusion.

The position-regulating protrusion 33 is inserted into the position-regulating hole 31 of the terminal 25. As illustrated in FIG. 6, the position-regulating hole 31 is formed so that the length L of the opening, as viewed in the axial direction of the terminal 25, may become larger than the height H of the position-regulating protrusion 33. Also, as illustrated in FIG. 7, the position-regulating hole 31 is formed so that the length D of the opening, as viewed in a direction intersecting the axial line of the terminal 25 at a right angle with respect thereto, may become larger than the thickness T of the position-regulating protrusion 33. Namely, the position-regulating protrusion 33 is movably loosely fitted into the position-regulating hole 31.

The position-regulating protrusion 33, that has been loosely fitted in the position-regulating hole 31, is disposed so that the steeple portion 33a may be situated on a first end of the terminal 25 with some clearance existing in between the steeple portion 33a and the position-regulating protrusion 33, and so that the convex wall 33b may be disposed on a middle portion of the terminal 25 with some clearance existing in between the convex wall 33b and the position-regulating protrusion 33 (see FIG. 7). Namely, the steeple portion 33a of the position-regulating protrusion 33 is arranged so that it can abut a first surface of the terminal 25, while the convex wall 33b can abut on a second surface of the terminal 25. In other words, the terminal 25 is made movable within a range from a position where it abuts the steeple portion 33a to a position where it abuts the convex wall 33b. Also, as illustrated in FIG. 6, the terminal 25 is made movable in its axial direction within a range from a position where it abuts an upper edge of the position-regulating hole 31 to a position where it abuts a lower edge of the position-regulating hole 31.

Next, a procedure of assembling the above-constructed for-use-on-board connector 21 will be explained.

Figure 8:
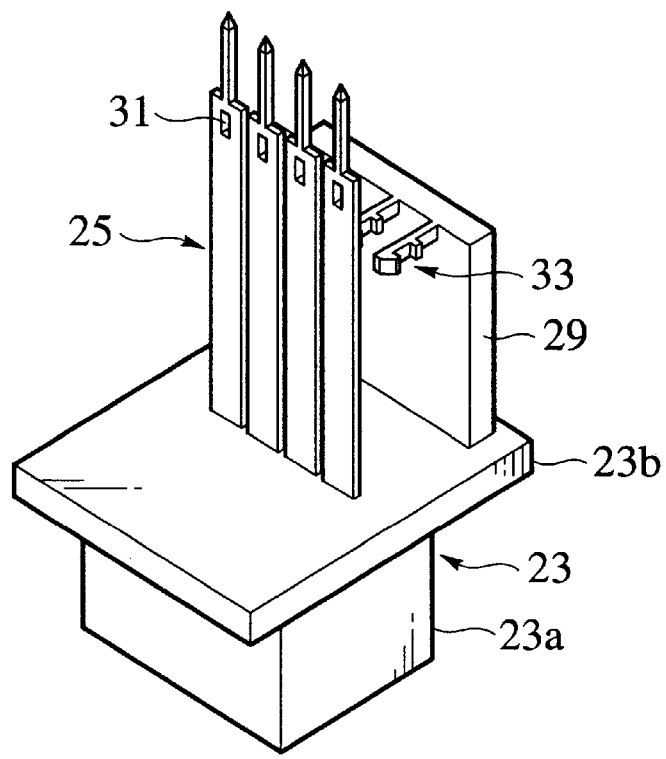
FIG. 8 is an outer-appearance perspective view illustrating the connector for-use-on-board before bending of the terminal that has been viewed from a terminal draw-out side.

As described above, the terminal 25 is projectingly provided by being insertion molded within the connector housing 23. In this case, the terminal 25 is insertion molded in a state of its being in the form of a straight line. Accordingly, in a state prior to performing the bending of the terminal 25, as illustrated in FIG. 8, the terminal 25 vertically protrudes from the surface of the flange portion 23b.

Figure 4:
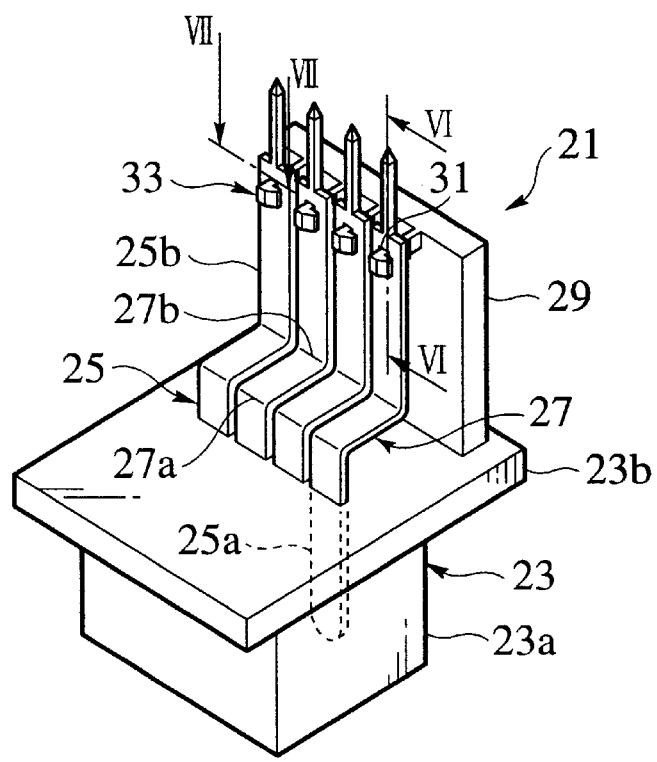
FIG. 4 is an outer-appearance perspective view illustrating a connector for-use-on-board, according to the present invention, that has been viewed from a terminal draw-out side.
Figure 9:
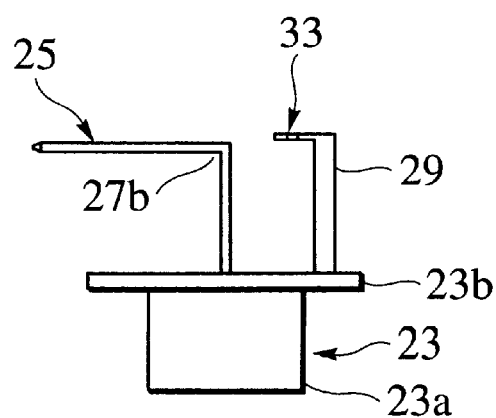
FIG. 9 is a side view illustrating a connector for use-on-board, the terminal of that is bent at a second bending portion.

In this state, first, as illustrated in FIG. 9, the terminal 25 is bent through 90° at its second bent portion 27b, and the forward end side thereof, having the position-regulating hole 31 formed therein, becomes parallel with the flange portion 23b. Thereafter, the first bent portion 27a, on the base-end side of the terminal 25 from the second bent portion 27b thereof, is bent through 90° in the opposite direction. As a result of this, as illustrated in FIG. 4, the forward end side, having the position-regulating hole 31 formed therein, becomes parallel with the arraying plate 29. At the time of this bending, the position-regulating hole 31 of the terminal 25 has the position-regulating protrusion 33 of the arraying plate 29 inserted thereinto. As a result of this, the connector 21 is in a state as illustrated in FIG. 4, whereby the terminal 25 is movably retained by the arraying plate 29 via the position-regulating protrusion 33.

Each terminal 25, that has been movably retained by the arraying plate 29 via the position-regulating protrusion 33, has a forward end of its leg portion 25b inserted into the insertion hole 13, which has been formed by being passed through the printed circuit conductor of the printed circuit board (not illustrated). Thereafter, the leg portion 25b is connected to the printed circuit conductor by soldering.

Figure 10:
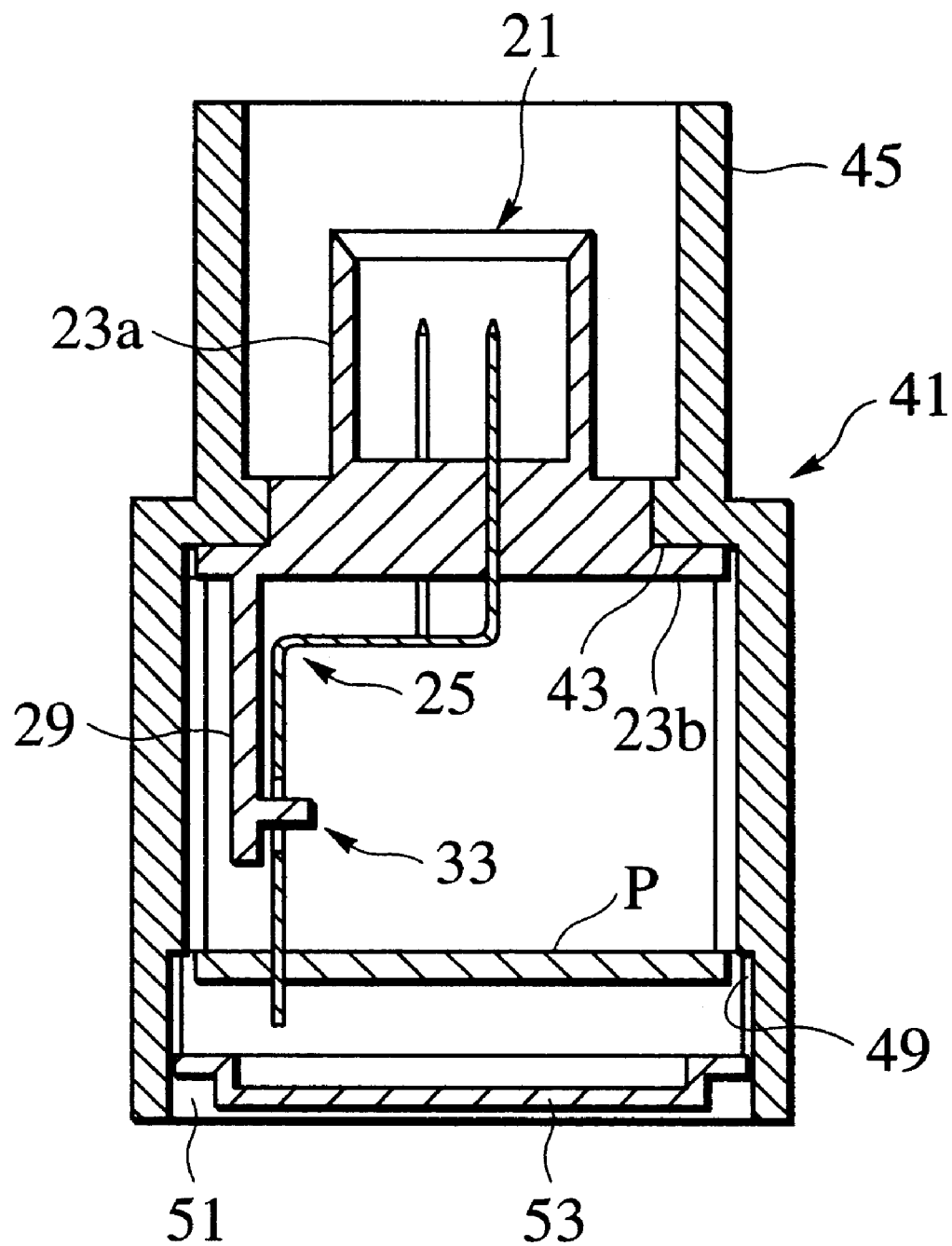
FIG. 10 is a cross-sectional view illustrating an example of use of the connector for-use-on-board that has been mounted on the board.

Referring to FIG. 10, the for-use-on-board connector 21 is used, for example, by being mounted within a connector accommodation case 41 that is formed into a hollow-cylindrical configuration. Within the connector accommodation case 41, a stepped portion 43 is formed that is fitted to the flange portion 23b. By the flange portion 23b being fitted to this stepped portion 43, the for-use-on-board connector 21 has its hood portion 23a disposed within a hood portion 45 of the connector accommodation case 41.

On the other hand, at a rear portion of the connector accommodation case 41, a stepped portion 49 is formed and on that stepped portion 49, a board P is seated. The board P is retained within the connector accommodation case 41 by being fitted to the stepped portion 49. In the rear portion of the connector accommodation case 41, an opening portion 51 is formed for inserting the for-use-on-board connector 21 therethrough. Once the for use-on-board connector 21 has been mounted within the case 41, the opening portion 51 is closed by a cover 53.

In this way, the for-use-on-board connector 21 is constructed such that each terminal 25 is retained and positioned and thus, the terminal 25 is movable within a prescribed range. As a result of this, at the time of soldering, even when the terminal 25 has been expanded or contracted, the amount of deformation of the terminal 25 is absorbed as a deformation of the terminal 25, as a whole. Thus, a large stress, occurring due to the deformation, ceases to be applied to the joint portion between the terminal 25 and the printed circuit conductor and solder cracks, that are likely when the terminal 25 is completely fixed, are prevented from occurring. Further, since the terminal 25 is positioned within a prescribed range, positioning of one of the connector housing 23 and the board P, relative to the other, would enable positional correspondence between the terminal 25 and the printed circuit conductor. This makes it possible to realize the assembling that is done using an automatic machine.

Also, the expansion or contraction of the terminal 25 is reliably absorbed by the bent portion 27. Therefore, as compared to the case where the terminal 25 is formed in a straight line and not bent, it is more unlikely that the stress will be applied to the joint portion between the terminal 25 and the printed circuit conductor or that solder cracks will occur. In addition, the arraying plate 29 is disposed along the bent terminals 25. Therefore, by the position-regulating hole 31 of the terminal 25 fitting loosely over the position-regulating protrusion 33 provided on the arraying plate 29, it is possible to movably retain each terminal 25 in a desired array.

Further, if the terminal 25 is projectingly provided within the connector housing 23 by insert molding, the base portion thereof can be reliably fixed without using a special fixing structure. As a result of this, a terminal structure, having a rigidly fixed base portion and a movable forward end, can be constructed in a simple form.

Incidentally, in the above-described embodiment, an explanation has been given of the case where the arraying plate 29 is provided on the connector housing 23 and on this arraying plate 29, the position-regulating protrusions 33 are provided. However, in the for-use-on-board connector 21 of the present invention, even when the position-regulating protrusions 33 are projectingly provided directly on the connector housing 23, the same advantages or effects, as those mentioned above, are obtained.

Although the present invention has been described above by reference to certain embodiments thereof, the present invention is not limited to the embodiments described above. Modifications and variations of the embodiments described above will occur to those skilled in the art, in light of the above teachings. The scope of the present invention is defined with reference to the following claims.

What is claimed is:

1. A connector for-use-on-board, comprising:
   a connector housing;
   a bar-like terminal protruding from said connector housing, wherein a forward end of said terminal is soldered to a printed circuit conductor of the board;
   a position-regulating hole which is formed in such a way as to pass through a position in a vicinity of a forward end of said terminal in a direction perpendicular to an axial line of said terminal;
   a position-regulating protrusion having a main body with a middle portion and first and second ends, said second end of said position-regulating protrusion being connected to said connector housing so that said position-regulating protrusion protrudes from said connector housing, said first end of said position-regulating protrusion having been passed through said position-regulating hole through said terminal, and said middle portion of said position-regulating protrusion being loosely fitted within said position-regulating hole with a prescribed clearance so that said terminal is retained and positioned to be movable within a prescribed range;

a base portion of said terminal which protrudes from said connector housing;

a bent portion which is formed in said terminal between said base portion and said position-regulating hole; and an arraying plate which protrudes from said connector housing, said arraying plate being provided with said position-regulating protrusion, said arraying plate being parallel with said terminal on a forward end side from said bent portion.

2. The connector for-use-on-board according to claim 1, wherein said terminal is mounted in said connector housing by insert molding in such a manner that said terminal projectingly protrudes from said connector housing.

3. The connector for-use-on-board according to claim 1, wherein said position-regulating hole has a length which is larger than a height of said position-regulating protrusion.

4. The connector for-use-on-board according to claim 1, wherein said position-regulating protrusion is somewhat F-shaped in cross-section.

5. The connector for-use-on-board according to claim 1, wherein said position-regulating protrusion includes a steeple portion protruding from said first end thereof.

6. The connector for-use-on-board according to claim 5, wherein said position-regulating hole has a width which is only slightly larger than a width of said position-regulating protrusion at a maximum protruding portion of said steeple portion.

7. The connector for-use-on-board according to claim 5, wherein said position-regulating protrusion includes a convex wall protruding from said middle portion thereof.

8. The connector for-use-on-board according to claim 7, wherein said steeple portion and said convex wall form a space for movably retaining and positioning said terminal.

9. A connector for-use-on-board, comprising:

a connector housing;

a bar-like terminal protruding from said connector housing, wherein a forward end of said terminal is soldered to a printed circuit conductor of the board;

a position-regulating hole which is formed in such a way as to pass through a position in a vicinity of a forward end of said terminal in a direction perpendicular to an axial line of said terminal; and a position-regulating protrusion having a main body with a middle portion and first and second ends, said second end of said position-regulating protrusion being connected to said connector housing so that said position-regulating protrusion protrudes from said connector housing, said first end of said position-regulating protrusion having been passed through said position-regulating hole through said terminal, and said middle portion of said position-regulating protrusion being loosely fitted within said position-regulating hole with a prescribed clearance so that said terminal is retained and positioned to be movable within a prescribed range, wherein said position-regulating protrusion includes a steeple portion protruding from said first end thereof and a convex wall protruding from said middle portion thereof.

10. The connector for-use-on-board according to claim 9, wherein said terminal is mounted in said connector housing by insert molding in such a manner that said terminal projectingly protrudes from said connector housing.

11. The connector for-use-on-board according to claim 9, wherein said steeple portion and said convex wall form a space for movably retaining and positioning said terminal.

12. The connector for-use-on-board according to claim 9, wherein said position-regulating hole has a width which is only slightly larger than a width of said position-regulating protrusion at a maximum protruding portion of said steeple portion.

13. The connector for-use-on-board according to claim 9, wherein said position-regulating hole has a length which is larger than a height of said position-regulating protrusion.

14. The connector for-use-on-board according to claim 9, wherein said position-regulating protrusion is somewhat F-shaped in cross-section.

15. The connector for-use-on-board according to claim 9, further comprising:

a base portion of said terminal which protrudes from said connector housing;

a bent portion which is formed in said terminal between said base portion and said position-regulating hole; and an arraying plate which protrudes from said connector housing, said arraying plate being provided with said position-regulating protrusion, said arraying plate being parallel with said terminal on a forward end side from said bent portion.

16. The connector for-use-on-board according to claim 15, wherein said terminal is mounted in said connector housing by insert molding in such a manner that said terminal projectingly protrudes from said connector housing.

17. A connector for-use-on-board, comprising:

a connector housing;

a bar-like terminal protruding from said connector housing, wherein a forward end of said terminal is soldered to a printed circuit conductor of the board;

a position-regulating hole which is formed in such a way as to pass through a position in a vicinity of a forward end of said terminal in a direction perpendicular to an axial line of said terminal; and a position-regulating protrusion having a main body with a middle portion and first and second ends, said second end of said position-regulating protrusion being connected to said connector housing so that said position-regulating protrusion protrudes from said connector housing, said first end of said position-regulating protrusion having been passed through said position-regulating hole through said terminal, and said middle portion of said position-regulating protrusion being loosely fitted within said position-regulating hole with a prescribed clearance so that said terminal is retained and positioned to be movable within a prescribed range, wherein said position-regulating protrusion is somewhat F-shaped in cross-section.

18. The connector for-use-on-board according to claim 17, wherein said terminal is mounted in said connector housing by insert molding in such a manner that said terminal projectingly protrudes from said connector housing.

19. The connector for-use-on-board according to claim 17, wherein said position-regulating hole has a length which is larger than a height of said position-regulating protrusion.

20. The connector for-use-on-board according to claim 19, further comprising:

a base portion of said terminal which protrudes from said connector housing;

a bent portion which is formed in said terminal between said base portion and said position-regulating hole; and an arraying plate which protrudes from said connector housing, said arraying plate being provided with said position-regulating protrusion, said arraying plate being parallel with said terminal on a forward end side from said bent portion.

21. The connector for-use-on-board according to claim 20, wherein said terminal is mounted in said connector housing by insert molding in such a manner that said terminal projectingly protrudes from said connector housing.

22. The connector for-use-on-board according to claim 17, wherein said position-regulating protrusion includes a steeple portion protruding from said first end thereof.

23. The connector for-use-on-board according to claim 22, wherein said position-regulating hole has a width which is only slightly larger than a width of said position-regulating protrusion at a maximum protruding portion of said steeple portion.

24. The connector for-use-on-board according to claim 22, wherein said position-regulating protrusion includes a convex wall protruding from said middle portion thereof.

25. The connector for-use-on-board according to claim 24, wherein said steeple portion and said convex wall form a space for movably retaining and positioning said terminal.

* * * * *